United States Patent [19]

Hofmann

[11] 4,075,701
[45] Feb. 21, 1978

[54] METHOD AND CIRCUIT ARRANGEMENT FOR ADAPTING THE MEASURING RANGE OF A MEASURING DEVICE OPERATING WITH DELTA MODULATION IN A NAVIGATION SYSTEM

[75] Inventor: Fritz Hofmann, Munich, Germany

[73] Assignee: Messerschmitt-Bolkow-Blohm Gesellschaft mit beschrankter Haftung, Munich, Germany

[21] Appl. No.: 654,960

[22] Filed: Feb. 3, 1976

[30] Foreign Application Priority Data

Feb. 12, 1975 Germany .............................. 2505838
Jan. 23, 1976 Germany .............................. 2602496

[51] Int. Cl.² .................... G01C 21/16; G06F 15/50; G01R 15/08
[52] U.S. Cl. .................................. 364/579; 324/115; 325/38 B; 332/11 D; 340/347 NT; 364/453; 364/605; 364/831
[58] Field of Search .............. 235/151.3, 183, 150.2, 235/150.25, 150.26, 150.27, 183, 150.51; 340/347 NT; 324/115; 307/235 R; 332/11 D; 325/38 B

[56] References Cited

U.S. PATENT DOCUMENTS

| | | | |
|---|---|---|---|
| 3,470,367 | 9/1969 | Frisby et al. ........................ | 235/183 |
| 3,617,885 | 11/1971 | Wheable ........................... | 324/115 X |
| 3,772,683 | 11/1973 | Dorey ............................... | 340/347 NT |
| 3,774,018 | 11/1973 | Spreitzhofer ............ | 340/347 NT X |
| 3,829,659 | 8/1974 | Margolis ...................... | 235/150.25 X |
| 3,873,918 | 3/1975 | Talbert ............................. | 324/115 X |

*Primary Examiner*—Joseph F. Ruggiero
*Attorney, Agent, or Firm*—Toren, McGeady and Stanger

[57] ABSTRACT

A method and circuit arrangement for changing the sensitivity of the measuring range in a device employing delta modulation in a navigation system. The device uses an integrator for integrating a measured value from a sensor, a threshold detector following the integrator, a synchronizer responsive to the threshold detector and a pulse transmitter driven by the synchronizer. The pulse transmitter provides a reset pulse with appropriate release time to reset the integrator, the reset pulse being counted by a counter fed to a navigation computer. A switching arrangement at the input of the integrator operates to change the sensitivity or scale factor. Switching is controlled by logic circuitry which responds to the level of the measured value as well as the output of the integrator. The reset pulse release time is also employed as a switching criterion. Means for providing a dynamic measured value and for taking into account the anticipated customary deflections of the sensor are included as additional switching criteria. Means for correcting for zero point error which includes means for changing input sensitivities are also disclosed.

4 Claims, 6 Drawing Figures

METHOD AND CIRCUIT ARRANGEMENT FOR ADAPTING THE MEASURING RANGE OF A MEASURING DEVICE OPERATING WITH DELTA MODULATION IN A NAVIGATION SYSTEM

FIELD OF THE INVENTION

The invention concerns a method and related circuit arrangement for adapting and changing the sensitivity of the measuring range of a measuring device working with delta-modulation in a navigation system where the measured value is at first integrated in an integrator until a following threshold switch responds and operates on a pulse transmitter connected by way of a synchronizer to effect the release of a pulse. This pulse, in turn, serves to reset the integrator by one pulse weight and is stored at the same time in a counter at the input of a navigation computer. The release time of the pulse transmitter is fed by means of the synchronizer into a time frame which is suited to the rest of the periphery of the navigation computer.

BACKGROUND OF THE INVENTION

Methods and circuit arrangements are used in inertial navigation systems which are based on the idea of measuring accelerations to derive therefrom, by integration over a time interval, the course covered by a ship, airplane or space craft. This requires an earth-bound or space-bound coordinate system. Both coordinate systems can be realized by means of gyro-stabilized platforms.

A space-bound coordinate system is used, for example, for space rockets and other missiles which move far from the earth. The accelerations are measured here relative to a platform stabilized in space. The influence of the gravitational acceleration of the earth is taken into account by the computer. Earth-bound vehicles and airplanes, however, require a platform which is so corrected that it remains constantly horizontal and oriented in a fixed direction.

Frequently used in airplanes are inertial navigation systems where two or three gyros arranged in the horizontal plane with their axes perpendicular to each other act as direction-maintaining gyros during the flight. Two or three accelerometers measure the accelerations in two or three directions perpendicular to each other, so that the path components covered in both partial directions are determined in a navigation computer by double integration, taking into account the rotation of the earth and the Coriolis acceleration. In order to keep the system carrier platform arranged in the horizontal plane constantly horizontal and oriented to the grid north, the angular velocities are calculated from the velocity components, taking into account the rotation of the earth, in the three directions of the space with which the gimballed system carrier platforms must be connected, see for example, (Lueger: Lexikon der Technik, vol. 12, keyword: "inertial navigation").

Difficulties are encountered in gimballed horizontal carrier platforms insofar as the interfering horizontal accelerations are added up on long trips or flights which can lead to considerable navigational errors. It has been tried in the past to eliminate these errors by selecting a correspondingly long natural oscillation period of the carrier platform. Minor natural oscillations are acceptable.

A recent, similarly known navigation system overcomes these difficulties in that all gimbal frames and the motors and tracking devices connected therewith are eliminated and the sensors, hence the gyros and accelerometers, are simply secured to the floor of the vehicle. These navigation systems are called strapdown navigation systems. But since the sensors, that is, the gyros and accelerometers, are mechanically rigidly connected with the vehicle, they must work in a wide dynamic range because they follow all movements of the vehicle. For this reason, it is very difficult to obtain accurate measuring data. On the one hand, minute zero point-and resolution errors may be integrated on long flights or trips to considerable navigational errors. On the other hand, however, strong brief deflections as can appear, for example, during the takeoff of airplanes or by wind gusts, must be fully determined.

For the solution of this problem, presently known navigation systems use gyros and accelerometers with electrical restraint, which permit high, brief overloading of the caging coils and their magnetic circuits. In these instruments, the briefly admissible modulation range (ratio of maximum measured value/smallest still measurable value) is of the order of $10^4$ to $10^6$.

In strap-down navigations systems, the reference system, which is otherwise fixed mechanically in the position of the gimbal frames to each other, must also be determined, in addition to the sensor data. Since all data must be measured to this end, starting from the takeoff, and must be fed into the computer which then determines the position in space by many iteration steps, particularly accurate measuring data are required in these navigation systems.

Aggravating is the fact that analog-digital converters or amplitude-frequency converters are used for feeding the measuring data into the computer. In this way, quantization errors of the scanning, which can be repeated in each scanning cycle and will thus accumulate over the entire navigation time, have to be added to the zero point-and linearity errors.

In order to take into account zero point errors of various units, it is known to reverse the gyro spin direction during the navigation so that the drift of the gyro is likewise reversed and substantially compensated with increasing navigation time. An arrangement is known for determining the zero point error where the gyros and accelerometers are arranged on a reversing table and where the reversing table is rotatable by 180°. There is a risk, however, that the time frame necessary for evaluating the measured value will no longer be maintained during the reversal of the electrical units.

According to the state of the art, so-called delta modulation is frequently used in the measured value converter acting as an analog-digital converter. Here the measured value is first integrated in an integrator until the threshold switch at the output of the integrator responds and a following pulse transmitter releases a unit resetting pulse. A synchronizer arranged between the threshold switch and the pulse transmitter can bring the release time into a time slot frame which is suited to the rest of the periphery of the navigation computer. The unit resetting pulse is stored by a counter at the input of the navigation computer and resets the integrator by one pulse weight at the same time.

In an electrically restrained rate gyro acting as a primary element, a pulse corresponds e.g: to angle increment $\Delta \alpha = \int \dot{\alpha} \cdot dt$, where $\alpha$ is the angle and $\dot{\alpha}$ is the differentiated angle with respect to time. In an accelerometer, a pulse would correspond to a velocity increment.

In order to be able to supply the pulses more accurately, the maximum modulation frequency is selected in this delta modulation technique which is not higher than 10 to 100 kHz. If a vehicle undergoes in a measuring axis very small deflections, but alternating over a long period of time, the measured value modulator gives off a pulse only every 10 seconds, for example, with a scaling of 100 kHz for full deflection and a modulation range of $10^6$. Such a delayed quantization is undesirable, however, particularly in a strap-down navigation systems, because the vehicle can turn considerably within 10 seconds and thus falsify the correlation between the earth-bound and the vehicle-bound coordination system.

OBJECTS OF THE INVENTION

An object of the present invention therefore is the provision of a method and circuit arrangement for changing the sensitivity of a device employing delta modulation in a navigation system.

Another object of the present invention is the provision of a method for changing the sensitivity of a device employing delta modulation in a navigation system wherein the sensitivity is changed without introducing errors into the navigation loop.

An additional object of the present invention is the provision of a method and circuit arrangement for simultaneously correcting zero point error and changing the sensitivity of a device employing delta modulation in a navigation system.

A further object of the present invention is the provision of a method and circuit arrangement for changing the sensitivity or scale factor of a device employing delta modulation in a navigation system which has low sensitivity to interference and wherein the quantization is effected in sufficiently short intervals, even with small measured values.

SUMMARY OF THE PRESENT INVENTION

In accordance with the present invention, a method is encompassed for adapting the measuring range of a measuring device employing delta modulation in a navigation system to the magnitude of the measured signal. The device employs an integrator for response to the measured value, a threshold switch coupled to the output of the integrator, the threshold switch being coupled by way of a synchronizer to a pulse transmitter. The pulse transmitter provides pulses to reset the integrator by a single pulse weight at a time. The reset pulses are also being supplied at the same time for a counter at the input of a navigation computer. The synchronizer is fed by a signal for controlling the release time of the pulse transmitter. The method comprises the steps of determining the relative magnitude of the measured value signal, determining the magnitude of the output of the integrator and determining whether a criterion has been met wherein the magnitude of the measured value has exceeded or dropped below a predetermined value for changing to a different sensitivity at the input to the integrator. Further included are the steps of changing the sensitivity at the input to the integrator when said criterion has been met and when the magnitude of the output of the integrator is sufficiently small and controlling the changing of the sensitivity at the input of the integrator by using the release time of the pulse transmitter as a criterion.

Additional aspects of different forms of the method according to the invention include the controlling of the changing of sensitivity with a dynamically corrected measured value, the accounting for anticipated customary deflections of the vehicle snesor and wherein the said switching occurs only after the said customary deflections are exceeded. The method according to the invention also encompasses correcting for zero pointing error while also permitting the changing of the input sensitivity.

Also in accordance with the present invention, an improvement in a measuring device operating with delta modulation in a navigation system is encompassed. The system is of the type including an integrator for integrating a measured value and a threshold detector responsive to the integrator. The threshold detector is coupled by way of a synchronizer to a pulse transmitter. The pulse transmitter provides a pulse to reset the integrator by one pulse weight, the pulse being stored at the same time in a counter at the input of a navigation computer. The synchronizer controls the release time of the pulse transmitter to provide a time frame which is suited to the rest of the periphery of the navigation computer. The improvement in the device comprises scaling means provided at the input to the integrator for controlling the level of measured signal supplied to the integrator, and switching means coupled to the sealing means for effecting a change of scale factor. Logic means responsive to reset pulses from the pulse transmitter for controlling the switching means and gating means responsive to the measured value signal and the output of the integrator for providing a control signal to the logic means are also included. The control signal from the gating means is effective to cause the switching means to change scale when said measured value exceeds or is less than a predetermined value and said integrator output is a small value.

For a better understanding of the present invention together with other and further objects thereof, reference is made to the following description and accompanying drawings, while the scope of the invention is pointed out in the appended claims.

DETAILED DESCRIPTION OF THE INVENTION

Figure 1:
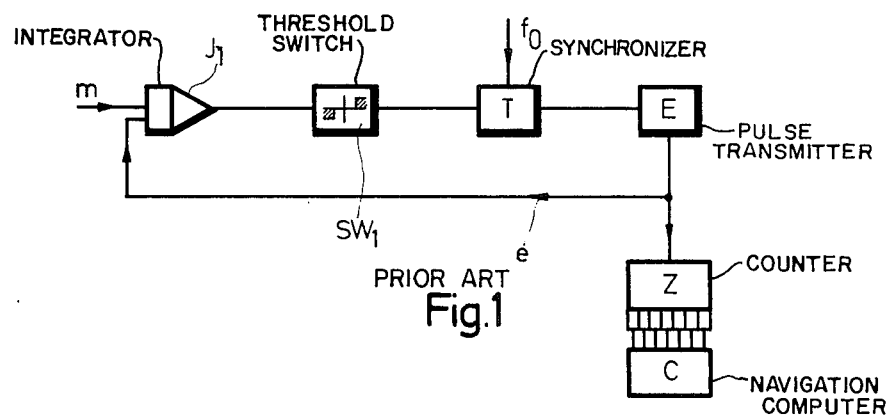
FIG. 1 shows an arrangement of the measuring device with delta modulation according to the state of the art.

In FIG. 1, the measured value m, which is provided by an electrically restrained rate gyro as a primary element, is supplied to the input of an integrator $J_1$. The measured value m is integrated until a threshold switch $SW_1$ following the integrator $J_1$ responds and a pulse transmitter E connected by way of a synchronizer T with the threshold switch $SW_1$ provides a unit resetting pulse e. The synchronizer T brings the release time of the pulse transmitter E into a time frame fo which is tuned to the rest of the periphery of a navigation computer C connected by way of counter Z with the pulse transmitter E. *) The unit resetting pulse arrives on the second input of the integrator $J_1$, resetting the integrator by one pulse weight. In addition, the unit resetting pulse is stored in counter Z and is transmitted from there to the navigation computer C. *) A navigation computer used in FIG. 1 is known for example from Avionics Navigation Systems, edited by Myron Kayton and Walter Fried, New York 1969, pages 283 till 285, or from Honeywell system H 478, publication No. 11440, June 1973.

FIG. shows an arrangement with measuring range adaptation. The known arrangement represented in FIG. 1 is expanded at the measured value input by a scaling means, such as a voltage divider where a resistance R can be bridged by a switching means such as an electromagnetic rescaling switch Um. The switching by way of the rescaling switch Um can only be effected when the integrator $J_1$ is in the immediate proximity of zero, since only in this way can the carryover taken over erroneously from the old scaling factor into the new time interval after the switching be kept small. The switching criterion is derived selectively from the unit resetting pulses in connection with a logic stage L (input 1) whose output is connected with the magnetic winding of the rescaling switch Um, or from a release unit F, which consists of a simple gate circuit and which scans the respective state of the integrator $J_1$ by the input c. The input a of the release unit F thus, like the input 2 of the logic stage L, is coupled to the tap of the voltage divider of the measured value. The release unit F provides, at its output b, a release signal $f$, which arrives on the third input of the logic stage L.

Since the logic stage L must switch to an insensitive measuring range during large deflections, and to a sensitive measuring range upon small deflections, and the number of switchings should be as small as possible, the logic stage L is operated selectively in connection with a transducer MU or a time programming attachment ZW. The input d of the transducer MU is connected with the tap of the voltage divider on the measured value input. The output of the transducer MU carries the signal $m^*$ and is connected with the input 4 of the logic stage L. The output of the time programming attachment ZW carrying the control signal $t^*$ is supplied to the input 5 of the logic stage L. The transducer MU and the time programming attachment ZW receive either the unit resetting pulses e or they are connected with the release unit F. In addition, the transducer MU and the time programming attachment ZW in the time frame pattern fo are clocked by the clock TG.

Figure 3:
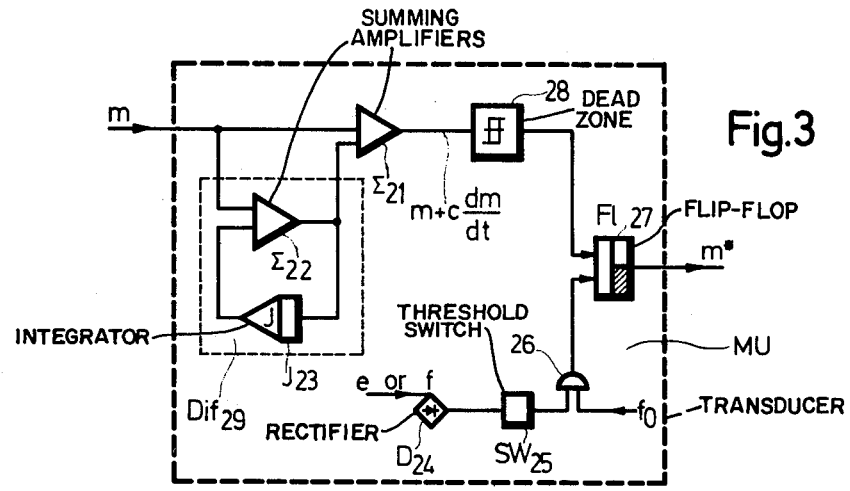
FIG. 3 shows a block circuit diagram of a transducer for use with the present invention.

The wiring of the transducer MU is represented in FIG. 3. The measured value m arrives at first on the differentiator $Dif_{29}$, which consists of the integrator $J_{23}$ and the summing amplifier $\Sigma 22$. A following summing amplifier $\Sigma 21$ adds the output signal of the differentiator $DIF_{29}$ and the measured value $m$, so that the aggregate signal $m + c\, dm/dt$ is available at its output. This aggregate signal is conducted over a dead zone 28 to the first input of the storage flip flop $Fl_{27}$. On the second input of the storage flip flop $Fl_{27}$, is supplied a clock signal which is derived selectively from the unit resetting pulse $e$ or from the release signal $f$ in connection with the time frame $f_o$. In order to obtain the clock signal, the unit resetting pulses e or the release signal $f$ are conducted by way of a rectifier $D_{24}$ and a threshold switch $SW_{25}$ to the first input of an AND gate 26, while the second input is admitted with the time frame $f_o$ of the clock TG. The output of the AND gate 26 supplies the clock signal to the second input of the storage flip flop $Fl_{27}$. On the output of the storage flip flop $Fl_{27}$, the dynamically corrected measured value $m^* = m + c\, dm/dt$ is available in the time frame $f_o$.

Figure 4:
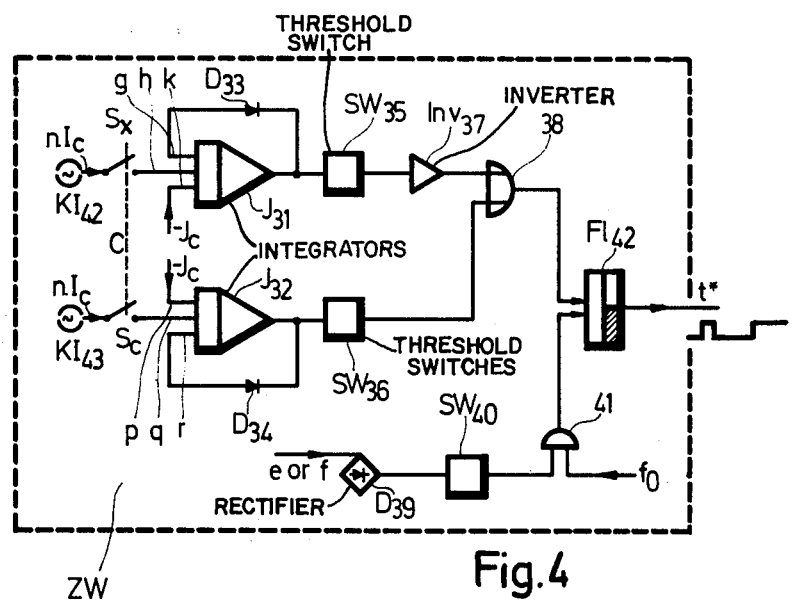
FIG. 4 shows a block circuit diagram of a time programming attachment for use in FIG. 2.

A block circuit diagram of the time programming attachment ZW is shown in FIG. 4. The time programming attachment ZW contains two integrators $J_{31}$ and $J_{32}$, which are charged at their inputs $k$ and $p$ respectively by the currents $-Ic$. The charging of the two integrators is effected from two constant current sources $KI_{42}$ and $KI_{43}$ respectively with the currents n.Ic through two switches Sx and Sc respectively which are controlled by the navigation computer C. The two integrators $J_{31}$ and $J_{32}$ each contain a feedback path with a diode $D_{33}$ and $D_{34}$ respectively from the output of the integrator to inputs g and r respectively. The diodes prevent a negative charge of the integrators by the current $-Ic$. Following each of the integrators $J_{31}$ and $J_{32}$, is arranged a threshold switch $SW_{35}$ and $SW_{36}$. While the output of the threshold switch $SW_{36}$ is connected directly with an input of a following OR-gate 38, the output of the threshold switch $SW_{35}$ is conducted by way of an inverter $Inv_{37}$ to a second input of the OR-gate 38. The output of the OR-gate 38 is connected to the first input of a following storage flip flop $Fl_{42}$. On the second input of the storage flip flop $Fl_{42}$, appears a clock signal in the same manner as in the transducer MU described in FIG. 4. The clock signal is obtained by means of a rectifier $D_{39}$ a threshold switch $SW_{40}$ and an AND-gate 41 from the time frame $f_o$, and the input resetting pulses e or the release signal $Fl_{42}$. The control signal $t^*$ is provided at the output of the storage flip flop $Fl_{42}$.

For the explanation of the operation of the time programming attachment ZW, it is assumed that the integrator $J_{31}$ is initially at zero. By feeding the current $n\cdot Ic$ over a time $t_x$, controlled by switch $S_x$, the integrator $J_{31}$ is set to an adjustable initial value. After a given navigation time, the integrator $J_{31}$ again attains the value zero. The integrator $J_{32}$ works in the same manner. Charging time and resetting time here are constant, however. By means of the threshold switches $SW_{35}$ and $SW_{36}$, a stepped control signal $t^*$ is formed. The measuring range is only switched if a resetting pulse e or a release signal $f$, the control edge of the time frame $f_o$ and a new input value appear on the storage flipflop $Fl_{42}$.

Figure 5:
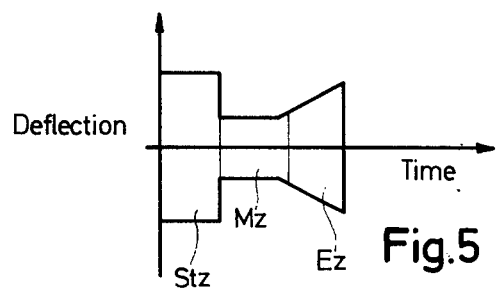
FIG. 5 shows a deflection profile of a vehicle.

FIG. 5 shows the deflection ranges of a vehicle in the takeoff-cruise- and end zone. Since alignment with the target and turning into the corresponding position is required during the takeoff of a vehicle, for example, during the launching of a missile, the greatest deflections are expected in the "takeoff" zone Stz. In the cruising zone Mz, the vehicle moves relatively steadily and evenly toward the target. When it approaches the target in the end zone Ez, corrections must be made again and a landing site, for example, must be approached accurately. The anticipated customary deflections in the individual motional phases of a vehicle must be taken into account in using time programming attachments and must be used as a basis for its setting.

Figure 2:
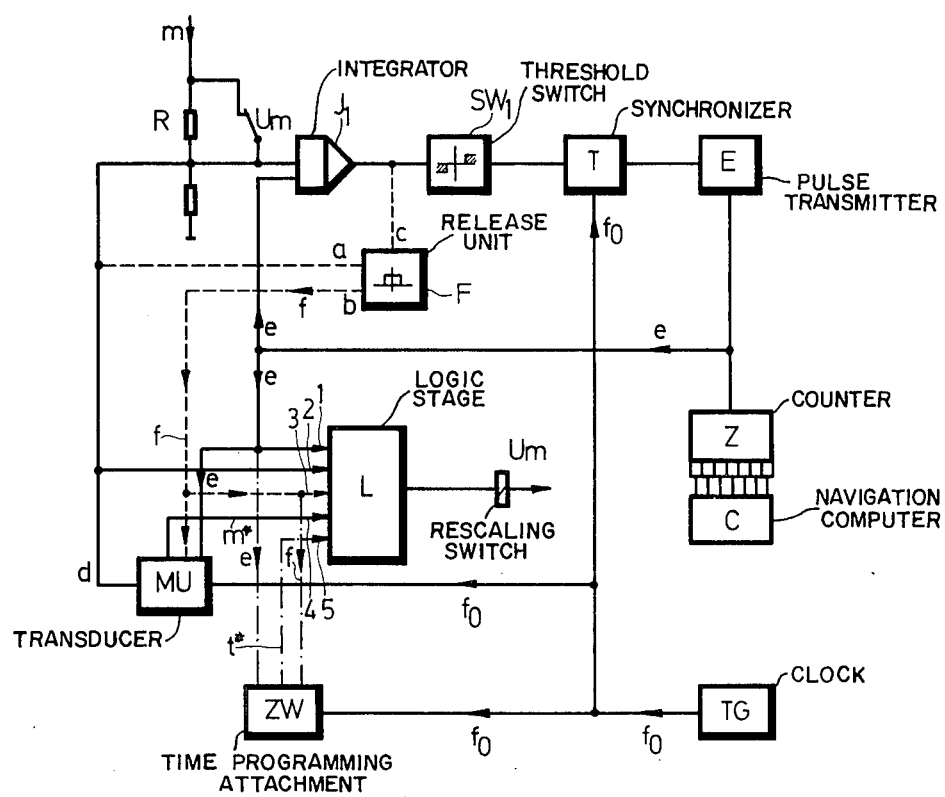
FIG. 2 shows an arrangement of the measuring device with delta modulation and adaptation of the measuring range according to the invention.
Figure 6:
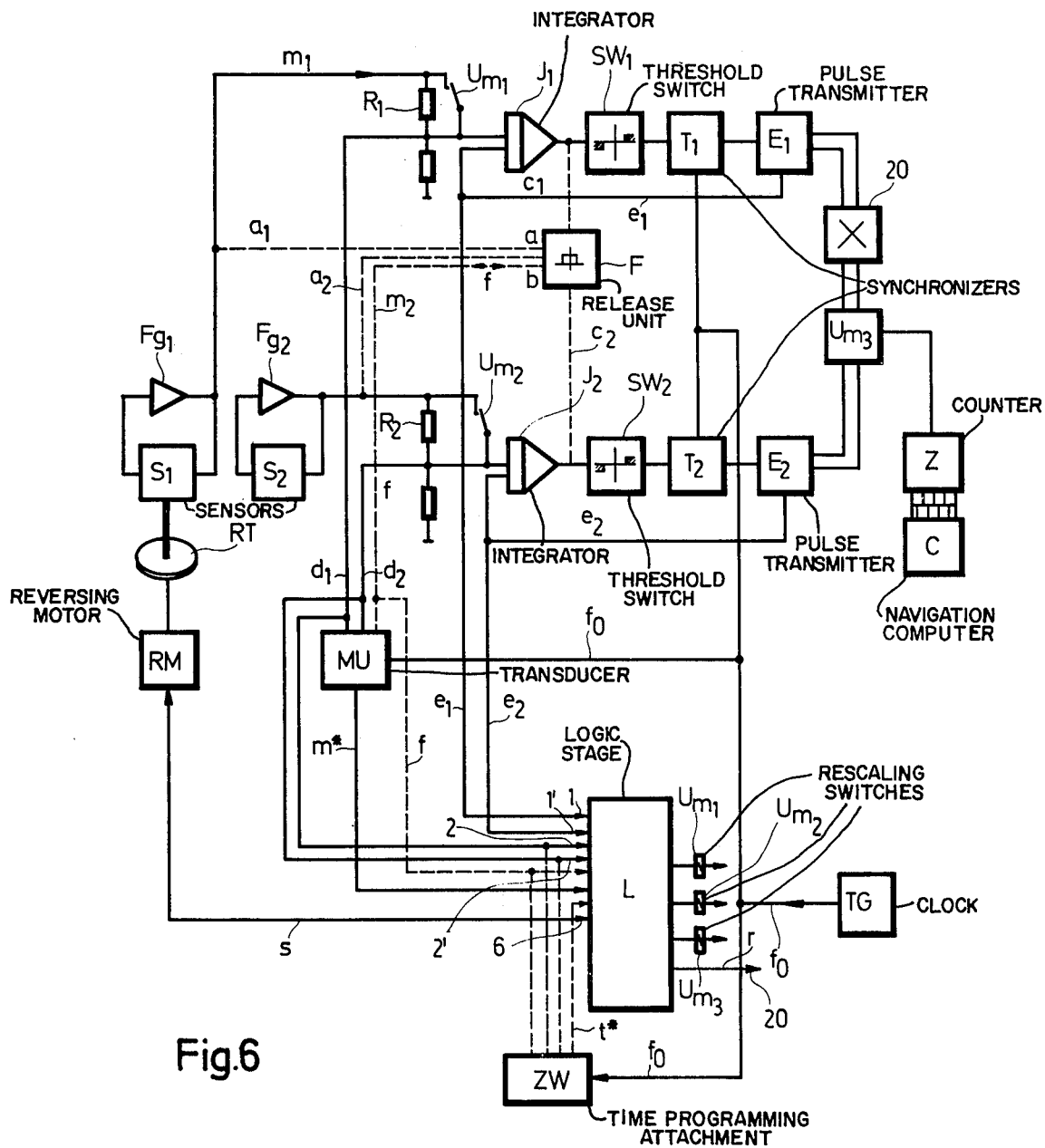
FIG. 6 shows an arrangement of the measuring device with delta modulation, measuring range adaptation, and zero point error correction according to the invention.

FIG. 6 shows an arrangement of the measuring device with delta modulation, measuring range adaptation, and zero point error correction according to the invention in a block circuit diagram. The arrangement shown in FIG. 2 is supplemented in FIG. 6 by a second measuring device, consisting of a second integrator $J_2$, a threshold switch $SW_2$ and a second synchronizer $T_2$, which receive the time frame $f_o$ from the clock TG. Both measuring devices receive their measured value signals m1 and m2 respectively from sensors $S_1$ and $S_2$ restrained by way of a feed-back $Fg_1$ and $Fg_2$ respectively. Sensor $S_1$ is coupled with a reversing table RT and a reversing motor RM, which is connected over a control line s with the logic stage L. The integrator $J_2$ of the second measuring device is preceded at its first input by a voltage divider, just as the integrator $J_1$ of the first measuring device, where a resistance R2 can be bridged by an electromagnetic switch $Um_2$ controlled by the logic state L. Both inputs of the integrator $J_2$ are connected with the inputs 1' and 2' of the logic stage L. The measuring range is switched by means of the electromagnetic switch $Um_2$, just as with the electromagnetic switch $Um_1$ bridging the resistor $R_1$ in the first measuring device, only when the integrator $J_2$ is in the immediate proximity of zero. The switching criterion is derived selectively from the unit and resetting pulses in connection with the logic stage L or from the release unit F as described above. The transducer MU, the time programming attachment ZW and the clock TG are connected in the same manner with the second measuring device and have the same functions as in FIG. 2.

The bipolar outputs of the pulse transmitters $E_1$ and $E_2$ are connected over an electromagnetic switch $Um_3$ controlled by the output of the logic stage L with the counter Z and the navigation computer C. Between the output of the pulse transmitter $E_1$ and the switch $Um_3$ is arranged a pole-reversing switch 20 which ensures a polarity-correct feeding of the measured value signal to the navigation computer C during the reversing process.

The reversing process, just as the switching of the measuring range, can thus only be effected if the integrators have approximately the value zero at their outputs, otherwise there is a risk that the value stored in the integrator of the delta modulation will be transmitted incorrectly to the following time range. The switching criterion for the reversing process is derived in the same manner as for the switching of the measuring range from the unit resetting pulses in connection with the logic stage L, which controls the reversing motor RM over the control line S, and whose ouputs are connected with the magnetic winding of the reversing switch $Um_3$, as well as the pole-reversing switch 20, or from the release unit F, which consists of a simple gate circuit and which scans the respective stage of the integrators over the inputs $C_1$ and $C_2$. The inputs $a_1$ and $a_2$ of the release unit F are coupled, just like the inputs 2 and 2' of the logical stage L, to the tap of the voltage dividers of the measured value inputs. The release unit F provides at its output b, a release signal f which arrives on the third input 3 of the logic stage L.

During the reversing process, the sensor $S_1$, on the reversing table RT is turned by the reversing motor RM by 180 degrees and at the same time the pole-reversing switch 20 is actuated over the line r by the logic stage L. During the reversing process, the sensor $S_1$ is disconnected. The measured value signals are fed during this time by sensor S2 to the navigation computer C over the second measuring device, consisting of $Um_2$, $R_2$, $T_2$ and $E_2$ over the electromagnetic switch $Um_3$.

The switching back to the sensor $S_1$ and to the first measuring device, consisting of $Um_1$, $R_1$, $J_1$, $SW_1$, $T_1$ and $E_1$, can likewise only be effected if a very small value appears on the output of the integrator $J_2$. The switching criterion is obtained here in the same manner as described above.

The method according to the invention for adapting the measuring range of delta modulators in navigation systems is particularly suitable for use in vehicles of all kinds having sensors with high initial deflection.

Thus, the objects of the invention are met by switching the input of the integrator between two different input sensitivities, so that the switching is only effected when a small signal appears on the output of the integrator and switching is necessary because of the size of the measured value signal. The release time of the pulse transmitter serves as a switching criterion.

The method and apparatus according to the invention is furthermore so designed that the switching criterion is obtained by scanning the integrator. According to another advantageous feature of the invention, the switching is effected with a dead-time. Furthermore, the switching may be effected by means of a dynamically corrected measured value and with a dead-time.

In order to avoid measuring errors caused by minor deflections of the vehicle, as they are customary in operation, a time control is provided according to another feature of the invention which takes into account the anticipated customary deflections, and switches only after this value is exceeded.

In order to take into account the zero point error in the computation of the course, the method and circuit arrangement according to the invention is furthermore so designated that the input of the integrator is switched to a measuring range with reversible measuring direction and different switchable input sensitivities for correcting the zero point error, and that a second equivalent measuring device is provided which supplies the measured signals during the reversal of the measuring direction, and the reversal of the measuring direction is only effected when a small signal appears at the output of the integrator.

A circuit arrangement for carrying out the method has been described where the measured value signal appears at the first input of an integrator whose output is conducted to the threshold switch which is connected by way of a synchronizer with a pulse transmitter. The output of the pulse transmitter is connected, on the one hand, by way of a counter to the input of a navigation computer and is fed back additionally to a second input of the integrator. A series-resistance, which can be bridged by a switch, is inserted into the lead on the first input of the integrator. The feedback from the pulse transmitter to the second input of the integrator bears additionally on the first input of a logic stage, whose output is connected with the excited winding of the switch. The measured value signal is supplied on a second input of the logic stage.

The circuit arrangement according to the invention is also designed so that the output of the integrator is connected additionally with the input of a release unit, so that the release unit has a measured value input, and so that its output is supplied to a third input of the logic stage.

According to another advantageous feature of the invention, the transducer is provided with a measured value input whose output is supplied to a fourth input of the logic stage, and which is connected selectively with the feedback of the pulse transmitter or the output of the release unit.

In order to take into account the anticipated customary deflections of the vehicle, the circuit arrangement according to the invention is so designed that a time programming attachment, which takes into account the anticipated customary deflections, is provided whose input is connected selectively with the feedback of the pulse transmitter or with the output of the release unit, and whose output is connected to a fifth input of the logic stage.

Finally, in order to be able to include additionally the zero point errors of the individual units in the computation of the navigation course, the circuit arrangement according to the invention is so designed that a restrained sensor arranged on a reversing table and giving off the measured value signal is coupled with a reversing table and a reversing motor which is connected over a control line to the logic stage, and so that a second restrained sensor giving off a measured value signal is connected over a series-resistance bridged by a second electromagnetic switch with the first input of a second integrator. Further, the output of the second integrator is connected over a second threshold switch and a second synchronizer tuned to the time frame to a second pulse transmitter which has a feedback to a second input of the integrator which is additionally supplied to an input of the logic stage whose second output is connected to the exciter winding of the second electromagnetic switch. The measured value signal given off by the second sensor is conducted to a second input of the logic stage. The output of the pulse transmitter is conducted over a pole-reversing switch and the output of the second pulse transmitter to the inputs of a third electromagnetic switch. In addition, the output of the third electromagnetic switch is connected by way of the counter to the input of the navigation computer.

The advantages achieved by the invention are such that an error-free reading is achieved with little engineering effort, the scaling factor pulse frequency/measured value being switchable at moments of small deflections of the vehicle, in order to effect quantization in sufficiently short intervals even with small measured values.

While the invention has been particularly shown and described with reference to the preferred embodiments thereof, it will be understood by those skilled in the art that various modifications and changes in form and detail may be made therein without departing from the true spirit and scope of the present invention.

What is claimed is:

1. A method for adapting the measuring range of a measuring device employing delta modulation in a navigation system to the magnitude of the measured signal, wherein the device employs an integrator for response to the measured value, a threshold switch coupled to the output of the integrator, the threshold switch being coupled by way of a synchronizer to a pulse transmitter which provides pulses to reset the integrator by a single pulse weight at a time, said reset pulses also being supplied at the same time to a counter at the input of a navigation computer, said synchronizer being fed by a signal for controlling the release time of the pulse transmitter, the method comprising the steps of:
   determining the relative magnitude of the measured value signal;
   determining the magnitude of the output of the integrator;
   determining whether a criterion has been met wherein the magnitude of the measured value has exceeded or dropped below a predetermined value for changing to a different sensitivity at the input to the integrator;
   changing the sensitivity at the input to the integrator when said criterion has been met and when the magnitude of the output of the integrator is sufficiently small; and
   controlling the changing of the sensitivity at the input of the integrator using said release time of the pulse transmitter as a criterion,
   said method also including the step of physically reversing the sensor providing said measuring signal to provide zero point error correction, providing a second measuring signal derived from a second sensor, a second delta modulation device being provided in response to said second measuring signal including a second integrator, second threshold detector, second synchronizer and second pulse transmitter, said second delta modulation device being controlled by a similar series of steps as said original delta modulation device to provide change in sensitivity at the second integrator input, the method also including switching the pulse transmitter outputs of said delta modulation devices to insure polarity-correct input to said counter and navigation computer, and controlling said switching between pulse transmitter outputs so that switching and reversing can occur only during low level signals at said integrator outputs.

2. In a measuring device operating with delta modulation in a navigation system of the type including an integrator for integrating a measured value, a threshold detector responsive to the integrator, said threshold detector being coupled by way of a synchronizer to a pulse transmitter, said pulse transmitter providing a pulse to reset the integrator by one pulse weight, said pulse being stored at the same time in a counter at the input of a navigation computer, said synchronizer controlling the release time of said pulse transmitter to provide a time frame which is suited to the rest of the periphery of the navigation computer, the improvement comprising:
   scaling means provided at the input of the integrator for controlling the level of measured signal supplied to the integrator;
   switching means coupled to said scaling means for effecting a change of scaling;
   logic means responsive to reset pulses from the pulse transmitter for controlling said switching means;
   gating means responsive to said measured value signal and said output of the integrator for providing a control signal to said logic means, said control signal being effective to cause said switching means to change scale when said measured value exceeds or is less than a predetermined value and said integrator output is a small value; and
   means for correcting for zero point error.

3. The device of claim 2 wherein said means for correcting for zero point error includes the provision of said measuring signal from a first sensor on a reversing table, means for reversing said table, said reversing means being controlled by a reversing control signal from said logic means, said first sensor providing said measuring signal, a second sensor, said second sensor providing a second measuring signal, said second measuring signal being coupled to a second delta modulation means including a second integrator, a second threshold detector, a second synchronizer and a second pulse transmitter, said device also including second scaling means at the input of the second integrator for controlling the level of measured signal applied to the second integrator, second switching means coupled to said second scaling means for effecting a change of scaling, said second switching means being controlled from said logic means; a third switching means, being controlled from said logic means for coupling one of the outputs of said pulse transmitters to said counter and navigation computer said third switching means including a polarity reversing elements, said gating means also responsive to the output of said second integrator and said second measuring signal, said gating means for providing a control signal for said logic means to control scaling when the measured signal being processed exceeds or is less than a predetermined value and the respective integrator output value is a small one, said device also supplying said reversing control signal to said reversing means when the output of the integrators are small.

4. A method for adapting the measuring range of a measuring device in a navigation system working with delta modulation, including the steps of:

integrating the measuring value in an integrator switchable between different input sensitivities, said integrating step continuing until a following threshold value switch responds;

providing a pulse by way of a pulse, generator which serves to reset the integrator by one pulse weight, and which is stored at the same time in a counter at the input of a navigational computer;

controlling the release time of the pulse generator by a synchronizer so that the pulse is timed according to the remaining periphery of the navigational computer;

controlling the switching between different input sensitivities of the integrator to take place only when a small signal appears at the output of the integrator and when switching is necessary because of the size of the data signal, the release time of the pulse generator serving as a switching criterion;

correcting the zeroing error of the measuring instrument by switching the input of the integrator to a measuring range with reversible measuring direction and different switchable input sensitivities; and providing a second equivalent measuring instrument for supplying data signals during the reversal of the measuring direction, the measuring direction being reversed only when a small signal appears at the output of the integrator.

* * * * *